US010860762B2

(12) United States Patent
Adler et al.

(10) Patent No.: US 10,860,762 B2
(45) Date of Patent: Dec. 8, 2020

(54) SUBSYSTEM-BASED SOC INTEGRATION

(71) Applicant: Intel Corporation, Santa Clara, CA (US)

(72) Inventors: Robert P. Adler, Santa Clara, CA (US); Husnara Khan, Chandler, AZ (US); Satish Venkatesan, San Jose, CA (US); Ramamurthy Sunder, Palo Alto, CA (US); Mukesh K. Mishra, San Jose, CA (US); Bindu Lalitha, Hillsboro, CA (US); Hassan M. Shehab, Santa Clara, CA (US); Sandhya Seshadri, Chandler, AZ (US); Dhrubajyoti Kalita, Santa Clara, CA (US); Wendy Liu, Santa Clara, CA (US); Hanumanth Bollineni, Santa Clara, CA (US); Snehal Kharkar, Santa Clara, CA (US)

(73) Assignee: Intel Corpration, Santa Clara, CA (US)

( * ) Notice: Subject to any disclaimer, the term of this patent is extended or adjusted under 35 U.S.C. 154(b) by 0 days.

(21) Appl. No.: 16/509,482

(22) Filed: Jul. 11, 2019

(65) Prior Publication Data
US 2019/0340313 A1 Nov. 7, 2019

(51) Int. Cl.
*G06F 30/327* (2020.01)
(52) U.S. Cl.
CPC .................. *G06F 30/327* (2020.01)
(58) Field of Classification Search
CPC ....... G06F 30/327; G01R 31/28; H01L 25/00; H01L 25/18
See application file for complete search history.

(56) References Cited

U.S. PATENT DOCUMENTS

| 5,432,785 A | 7/1995 | Ahmed et al. |
| 5,764,741 A | 6/1998 | Holender |

(Continued)

FOREIGN PATENT DOCUMENTS

| CN | 103684961 A | 3/2014 |
| WO | 2014059024 A1 | 4/2014 |

OTHER PUBLICATIONS

Abts, D., et al., Age-Based Packet Arbitration in Large-Radix k-ary n-cubes, Supercomputing 2007 (SC07), Nov. 10-16, 2007, 11 pgs.

(Continued)

*Primary Examiner* — Nha T Nguyen
(74) *Attorney, Agent, or Firm* — Spectrum IP Law Group LLC

(57) ABSTRACT

Methods and apparatus relating to subsystem-based System on Chip (SoC) integration are described. In one embodiment, logic circuitry determines one or more components of a subsystem. The subsystem supports an architectural feature to be implemented on a System on Chip (SoC) device. A first interface communicatively couples a first component of the subsystem to a first component of another subsystem. A second interface communicatively couples at least one component of the subsystem to at least one chassis component of the SoC device or communicatively couples the at least one component of the subsystem to at least one non-chassis component of the other subsystem. In an embodiment, components of the subsystem may be packaged such that the packaging generates a reusable collateral that allows for fast integration of all aspects of design in any SoC device with a compatible chassis prior to manufacture.

25 Claims, 7 Drawing Sheets

(56) References Cited

U.S. PATENT DOCUMENTS

| | | | |
|---|---|---|---|
| 5,991,308 A | 11/1999 | Fuhrmann et al. | |
| 6,003,029 A | 12/1999 | Agrawal et al. | |
| 6,249,902 B1 | 6/2001 | Igusa et al. | |
| 6,415,282 B1 | 7/2002 | Mukherjea et al. | |
| 6,925,627 B1 | 8/2005 | Longway et al. | |
| 7,065,730 B2 | 6/2006 | Alpert et al. | |
| 7,318,214 B1 | 1/2008 | Prasad et al. | |
| 7,590,959 B2 | 9/2009 | Tanaka | |
| 7,725,859 B1 | 5/2010 | Lenahan et al. | |
| 7,808,968 B1 | 10/2010 | Kalmanek, Jr. et al. | |
| 7,917,885 B2 | 3/2011 | Becker | |
| 8,050,256 B1 | 11/2011 | Bao et al. | |
| 8,059,551 B2 | 11/2011 | Milliken | |
| 8,099,757 B2 | 1/2012 | Riedle et al. | |
| 8,136,071 B2 | 3/2012 | Solomon | |
| 8,281,297 B2 | 10/2012 | Dasu et al. | |
| 8,312,402 B1 | 11/2012 | Okhmatovski et al. | |
| 8,407,167 B1 | 3/2013 | Abts | |
| 8,448,102 B2 | 5/2013 | Kornachuk et al. | |
| 8,492,886 B2 | 7/2013 | Or-Bach et al. | |
| 8,533,647 B1* | 9/2013 | Gangadharan | G06F 30/39 716/112 |
| 8,541,819 B1 | 9/2013 | Or-Bach et al. | |
| 8,543,964 B2 | 9/2013 | Ge et al. | |
| 8,601,423 B1 | 12/2013 | Philip et al. | |
| 8,635,577 B2 | 1/2014 | Kazda et al. | |
| 8,667,439 B1 | 3/2014 | Kumar et al. | |
| 8,705,368 B1 | 4/2014 | Abts | |
| 8,717,875 B2 | 5/2014 | Bejerano et al. | |
| 8,917,111 B1* | 12/2014 | Puranik | H03K 19/17748 326/38 |
| 9,633,158 B1* | 4/2017 | Jones | H03K 19/17728 |
| 2002/0071392 A1 | 6/2002 | Grover et al. | |
| 2002/0073380 A1 | 6/2002 | Cooke et al. | |
| 2002/0095430 A1 | 7/2002 | Egilsson et al. | |
| 2003/0063605 A1 | 4/2003 | Ravi | |
| 2004/0216072 A1 | 10/2004 | Alpert et al. | |
| 2005/0147081 A1 | 7/2005 | Acharya et al. | |
| 2006/0161875 A1 | 7/2006 | Rhee | |
| 2006/0268909 A1 | 11/2006 | Langevin et al. | |
| 2007/0016880 A1* | 1/2007 | Brinson | G06F 11/261 716/106 |
| 2007/0088537 A1 | 4/2007 | Lertora et al. | |
| 2007/0118320 A1 | 5/2007 | Luo et al. | |
| 2007/0244676 A1 | 10/2007 | Shang et al. | |
| 2007/0256044 A1 | 11/2007 | Coryer et al. | |
| 2007/0267680 A1 | 11/2007 | Uchino et al. | |
| 2008/0072182 A1 | 3/2008 | He et al. | |
| 2008/0120129 A1 | 5/2008 | Seubert et al. | |
| 2009/0070726 A1 | 3/2009 | Mehrotra et al. | |
| 2009/0070728 A1* | 3/2009 | Solomon | G06F 30/30 716/128 |
| 2009/0268677 A1 | 10/2009 | Chou et al. | |
| 2009/0313592 A1 | 12/2009 | Murali et al. | |
| 2010/0017656 A1* | 1/2010 | Park | G06F 11/261 714/27 |
| 2010/0040162 A1 | 2/2010 | Suehiro | |
| 2011/0022754 A1 | 1/2011 | Cidon et al. | |
| 2011/0035523 A1 | 2/2011 | Feero et al. | |
| 2011/0060831 A1 | 3/2011 | Ishii et al. | |
| 2011/0072407 A1 | 3/2011 | Keinert et al. | |
| 2011/0145909 A1* | 6/2011 | Rachakonda | G06F 15/7842 726/11 |
| 2011/0154282 A1 | 6/2011 | Chan et al. | |
| 2011/0191774 A1 | 8/2011 | Hsu | |
| 2011/0276937 A1 | 11/2011 | Waller | |
| 2012/0022841 A1 | 1/2012 | Appleyard | |
| 2012/0023473 A1 | 1/2012 | Brown et al. | |
| 2012/0026917 A1 | 2/2012 | Guo et al. | |
| 2012/0099475 A1 | 4/2012 | Tokuoka | |
| 2012/0110541 A1 | 5/2012 | Ge et al. | |
| 2012/0117363 A1* | 5/2012 | Cummings | H04W 8/22 713/1 |
| 2012/0155250 A1 | 6/2012 | Carney et al. | |
| 2013/0028090 A1 | 1/2013 | Yamaguchi et al. | |
| 2013/0051397 A1 | 2/2013 | Guo et al. | |
| 2013/0080073 A1 | 3/2013 | de Corral | |
| 2013/0103369 A1 | 4/2013 | Huynh et al. | |
| 2013/0124934 A1* | 5/2013 | Jones | G01R 31/31854 714/727 |
| 2013/0151215 A1 | 6/2013 | Mustapha | |
| 2013/0159944 A1 | 6/2013 | Uno et al. | |
| 2013/0174113 A1 | 7/2013 | Lecler et al. | |
| 2013/0185038 A1 | 7/2013 | Radu | |
| 2013/0207801 A1 | 8/2013 | Barnes | |
| 2013/0215733 A1 | 8/2013 | Jiang | |
| 2013/0219148 A1 | 8/2013 | Chen et al. | |
| 2013/0263068 A1 | 10/2013 | Cho et al. | |
| 2013/0326458 A1 | 12/2013 | Kazda et al. | |
| 2014/0068132 A1 | 3/2014 | Philip et al. | |
| 2014/0092740 A1 | 4/2014 | Wang et al. | |
| 2014/0098683 A1* | 4/2014 | Kumar | H04L 49/109 370/252 |
| 2014/0115218 A1 | 4/2014 | Philip et al. | |
| 2014/0115298 A1 | 4/2014 | Philip et al. | |
| 2015/0331043 A1* | 11/2015 | Sastry | G06F 21/31 714/727 |
| 2015/0382231 A1 | 12/2015 | Jabbar | |
| 2016/0070634 A1* | 3/2016 | Shirlen | G06F 11/3495 714/45 |
| 2016/0103723 A1* | 4/2016 | Hasan | G06F 11/22 714/33 |
| 2016/0146888 A1* | 5/2016 | Vooka | G06F 11/27 714/734 |
| 2017/0171913 A1* | 6/2017 | Cummings | H04W 48/16 |
| 2017/0185804 A1* | 6/2017 | Elbaz | G06F 13/287 |
| 2017/0315944 A1* | 11/2017 | Mayer | G06F 13/4282 |

OTHER PUBLICATIONS

Das, R., et al., Aergia: Exploiting Packet Latency Slack in On-Chip Networks, 37th International Symposium on Computer Architecture (ISCA '10), Jun. 19-23, 2010, 11 pgs.

Ebrahimi, E., et al., Fairness via Source Throttling: A Configurable and High-Performance Fairness Substrate for Multi-Core Memory Systems, ASPLOS '10, Mar. 13-17, 2010, 12 pgs.

Grot, B., Preemptive Virtual Clock: A Flexible, Efficient, and Cost-Effective QOS Scheme for Networks-on-Chip, Micro '09, Dec. 12-16, 2009, 12 pgs.

Grot, B., Kilo-NOC: A Heterogeneous Network-on-Chip Architecture for Scalability and Service Guarantees, ISCA 11, Jun. 4-8, 2011, 12 pgs.

Grot, B., Topology-Aware Quality-of-Service Support in Highly Integrated Chip Multiprocessors, 6th Annual Workshop on the Interaction between Operating Systems and Computer Architecture, Jun. 2006, 11 pgs.

Jiang, N. et al., Performance Implications of Age-Based Allocations in On-Chip Networks, CVA Memo 129, May 24, 2011, 21 pgs.

Lee, J_ W. et al., Globally-Synchronized Frames for Guaranteed Quality-of-Service in On-Chip Networks, 35th IEEE/ACM International Symposium on Computer Architecture (ISCA), Jun. 2008, 12 pgs.

Lee, M. M. et al., Approximating Age-Based Arbitration in On-Chip Networks, PACT '10, Sep. 11-15, 2010, 2 pgs.

Li, B. et al., CoQoS: Coordinating QoS-Aware Shared Resources in NoC-based Socs, J_ Parallel Distrib. Comput., 71 (5), May 2011, 14 pgs.

International Search Report and Written Opinion for PCT/US2013/064140, dated Jan. 22, 2014, 9 pgs.

International Search Report and Written Opinion for PCT/US2014/012003, dated Mar. 26, 2014, 9 pgs.

International Search Report and Written Opinion for PCT/US2014/012012, dated May 14, 2014, 10 pgs.

Ababei, C. et al., Achieving Network on Chip Fault Tolerance by Adaptive Remapping, Parallel & Distributed Processing, 2009, IEEE International Symposium, 4 pgs.

Beretta, I. et al., A Mapping Flow for Dynamically Reconfigurable Multi-Core System-on-Chip Design, IEEE Transactions on Computer-Aided Design of Integrated Circuits and Systems, Aug. 2011, 30(8), pp. 1211-1224.

(56) References Cited

OTHER PUBLICATIONS

Gindin, R. et al., NoC-Based FPGA: Architecture and Routing. Proceedings of the First International Symposium on Networks-on-Chip (NOCS"07). May 2007. pp. 253-262.
Yang, J. et al., Homogeneous NoC-based FPGA: The Foundation for Virtual FPGA. 1oth IEEE International Conference on Computer and Information Technology (CIT 2010). Jun. 2010. pp. 62-67.
International Search Report and Written Opinion for PCT/US2014/023625, dated Jul. 10, 2014. 9 pgs.
Gwangsun Kim, John Kim KAIST, "Memory-centric System Interconnected Design with Hybrid Memory Cubes", 2013 IEEE, pp. 145-155.
Anonymous, "System on a Chip—Wikipedia", May 17, 2018, retrieved on Feb. 25, 2019.
EP Extended Search Report dated Sep. 22, 2020, to EP Patent Application No. 20162621.
Wasson, Scott, "Inside Intel's Atom C2000-Series 'Avoton' Processors" The Tech Report, Sep. 4, 2013.

\* cited by examiner

US 10,860,762 B2

SUBSYSTEM-BASED SOC INTEGRATION

FIELD

The present disclosure generally relates to the field of electronics. More particularly, an embodiment relates to subsystem-based System on Chip (SoC) integration.

BACKGROUND

To provide more efficient computing systems, semiconductor manufacturers tend to package various electronic components on the same package (also referred to as an "SoC" or "SOC"). This approach can save physical space since a single semiconductor package is provided instead of multiple packages. Multiple packages would need to be separately powered and/or coupled via physical off-chip wires to allow for inter-component communication, which in turn would require more physical space.

As additional functionality is incorporated into a single SoC, the resulting complexity can complicate both the manufacturing and testing of the more complex SoCs.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
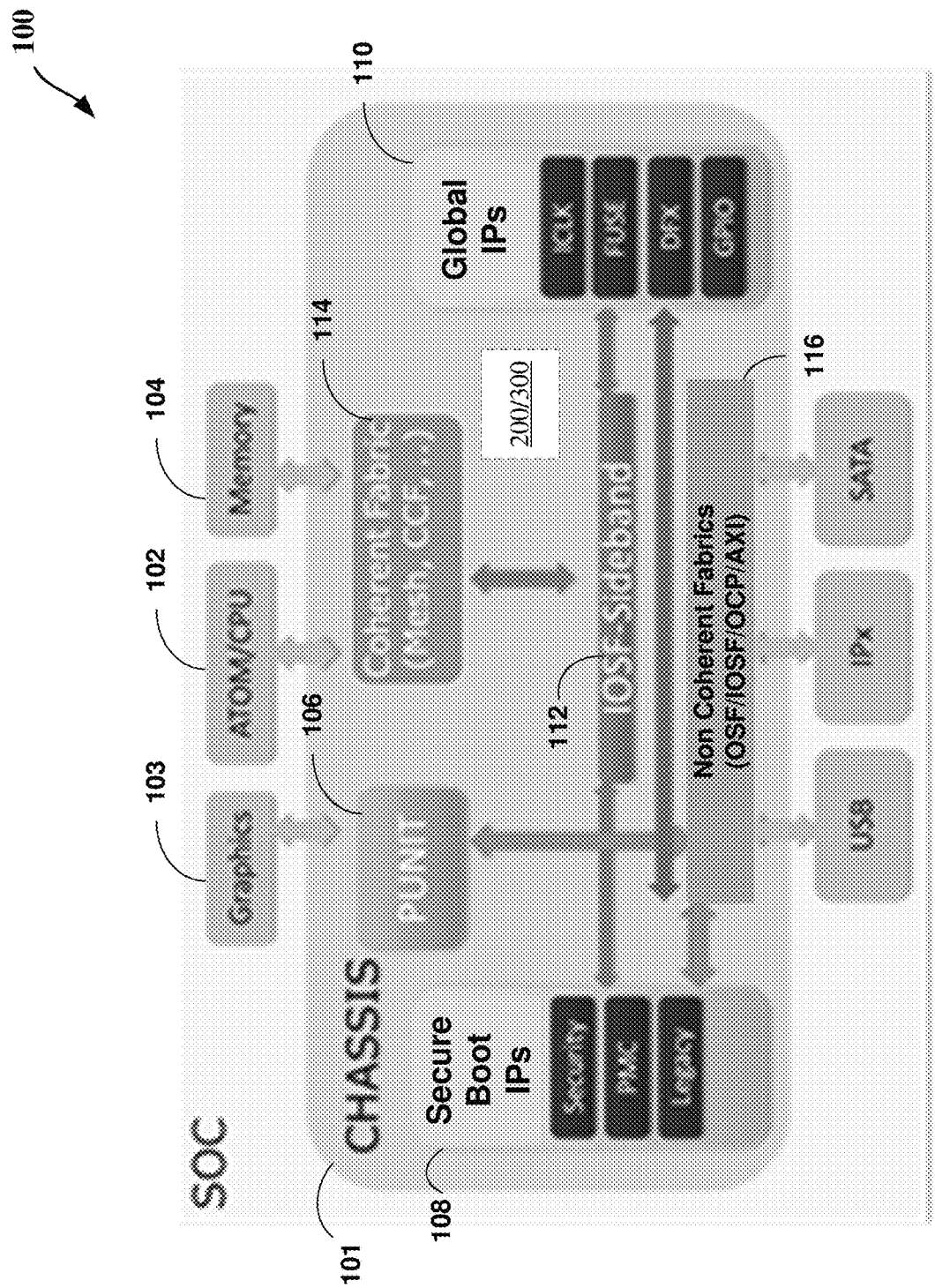
FIG. 1 illustrates a block diagram of an SoC, according to an embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware (such as logic circuitry or more generally circuitry or circuit), software, firmware, or some combination thereof.

As mentioned above, the additional functionality incorporated into a single SoC results in further complexity which can complicate both the manufacturing and testing of these more complex SoCs. In some implementations, the logic components of a function (also known as IPs or Intellectual Property blocks) may be validated standalone, and subsequently directly integrated into the SoC. The SoC integration may be done at a base component level and a typical SoC could easily include close to 500 instances to integrate. Such approaches fail to validate the IPs against a chassis since the end-product (or SoC) is the only entity where all of the required pieces for such validation are available.

By contrast, some embodiments relate to subsystem-based System on Chip (SoC) integration. In an embodiment, a subsystem abstracts (e.g., all) logic components that are required for an architectural function. The abstraction of the logic components may then be packaged as the end solution to support a correct and complete integration for all aspects required to design and/or test of the final SoC. As discussed herein, an "architectural function" or "architectural feature" generally refers to a portion of an SoC capable of performing one or more operations to provide a distinct function, such as a USB (Universal Serial Bus), a PCIe (Peripheral Component Interconnect express) interface, a Controller Area Network (CAN) Bus, a video function, or an audio function. The integration of the subsystem into the SoC chassis enables the validation of the entire architectural feature and its relationships to the other chassis features/functions required for functionality and test.

Moreover, the packaging of a subsystem creates a reusable collateral that enables fast integration for all aspects of design. Specifically, this packaging methodology can cover aspects of design beyond RTL (Register Transfer Level) integration, including but not limited to validation of content for (e.g., all) design tools, Unified Power Format (UPF) content, register validation content, any required fuse settings (e.g., where fuse settings may be implemented via logic, such as hardware, software, firmware, or combinations thereof), or any collateral used for integration of the IP into the SoC. The validation of the subsystem and all aspects of the integration with the chassis enables a correct and complete integration, and can guarantee functionality in any SoC of a compatible chassis.

As mentioned above, in some implementations, the logic components of a function (also known as IPs or Intellectual Property blocks) may be validated standalone and directly integrated into the SoC. However, the complexity of integration using such implementations tends to be high due to the large number of components (or IPs). For example, no reusable collateral for the architectural features is developed and hence every SoC integration has to go through a long and expensive process of discovery. Since the components are not validated against a chassis, integration of the IPs ends up taking a relatively large amount of time. Because there is not a structured way to pull in all collateral requirements to enable all aspects of design, collateral requirements for the various tools, flows, and methods can only be integrated in various ad hoc and manual ways; thus, increasing the effort required and leading to potential bugs indicative of manual editing.

Further, one embodiment defines a method to package components of an architectural function into a "subsystem" with well-defined interfaces to an SoC chassis. An implementation method may be further defined to package the design for reuse and integration into any compatible SoC chassis across (e.g., all) aspects of the design flow. Also, the developer of the subsystem may validate the subsystem and develop software with the subsystem and the chassis ahead of any actual product intercept or manufacture.

The number of components (sometimes referred to as "subsystems" herein) can be far fewer than in prior methods due to the abstraction (e.g., 500-1000 can be reduced to 30-40 components). The reduction in complexity leads to efficiency of integration. The developer of a subsystem may integrate the subsystem into a reference chassis and validate the subsystem well ahead of any actual usage of the subsystem in a product. Thus, the quality of the released component (subsystem) is far superior to prior methods (e.g., 70% reduction in issues found). Also, by creating a structure to describe the subsystem for (e.g., all) aspects of SoC design and not just RTL integration, some embodiments significantly reduce the total time required from start to tape-in/market.

FIG. 1 illustrates a block diagram of an SoC 100, according to an embodiment. One embodiment defines a chassis 101 architecture and some sample interfaces of the chassis. The chassis provides the infrastructure to support a set of IPs (to execute one or more architectural functions) to interact with other IPs. Examples of the interfaces include interfaces to communicate between: a processor/CPU 102 (which may be any general-purpose processor, such as an Atom® processor or Core™ processor including those provided by Intel® Corporation of Santa Clara, Calif.), graphics logic 103 (such as a graphics processor, Graphics Processing Unit (GPU), etc.) memory 104 (e.g., Double Data Rate (DDR) Random Access Memory (RAM), Static RAM, etc.), power management functional logic (e.g., Power Unit (PUNIT) 106), secure boot IPs 108 (e.g., to perform security function(s), a Power Management Controller (PMC), logic to support legacy hardware/firmware/software, etc.), global IP(s) 110 (e.g., to provide an integrated clock (ICLK), fuse(s), test/debug logic (DFX), General Purpose Input/Output (GPIO), etc.). In an embodiment, memory 104 stores data corresponding to operations to be performed by various components discussed herein such as the processor 102 and/or graphics logic 103. Memory 104 may also store data discussed herein with reference to the subsystem of FIG. 2 and/or data associated with operations of FIG. 4. Further, memory 104 may be the same or similar to the memory devices discussed with reference to FIGS. 5 and/or 6.

As shown in FIG. 1, the interfaces coupling the various components of the SoC 100 may include an OSF side band 112 (On-die or On-Chip System Fabric such as IOSF (Input/Output System Fabric) or Intel® OSF provided by Intel Corporation (which in at least one embodiment includes two interfaces, IOSF Primary and IOSF Sideband)) and/or one or more coherent fabric/interface(s)/implementation(s) 114 (such as a mesh network, Configurable Coherent Fabric (CCF) implementation, etc.), and/or non-coherent interface(s) 116 (e.g., including an OSF, IOSF, Open Core Protocol (OCP) fabric, Advanced Extensible Interface (AXI), etc.). As shown in FIG. 1, the non-coherent interface(s) 116 provide a communication channel with other (e.g., legacy) interfaces/buses such as USB, Internetwork Packet Exchange (IPx) interface, Serial Advanced Technology Attachment (SATA) interface, etc. In one example, the non-coherent fabric communicatively couples on-die IP blocks/components that require access to memory but that do not have internal caches that need to be kept coherent (i.e., consistent) with each other, processor caches, and main memory. Such an IP block may then implement the requisite logic to implement an external interface such as PCIe/USB/CAN/etc. The coherent fabric may be designed to keep internal caches inside such IP blocks/component coherent (i.e., consistent with each other). The components coupled via the non-coherent/coherent fabrics are not limited to the chassis components but could also include the other IP blocks (from the subsystem) that include cache(s)/memory.

In various embodiments, the SoC devices may include any chip design not specifically directed to any particular market segment. It can be a simple SOC, a companion chip or a complex SOC. In one exemplary embodiment, logic, interface(s)/fabric(s) and/or various components (including one or more of the components discussed with reference to FIG. 1 et seq.) may be mounted/integrated or otherwise physically coupled to a vehicle or an Internet of Things (IoT) device. As discussed herein, a "vehicle" generally refers to any transportation device capable of being operated autonomously (with little or no human/driver intervention), such as an automobile, a truck, a motorcycle, an airplane, a helicopter, a vessel/ship, a train, a drone, etc. whether or not the vehicle is a passenger or commercial vehicle, and regardless of the power source type (such as one or more of: fossil fuel(s), solar energy, electric energy, chemical energy, nuclear energy, etc.) and regardless of the physical state of the power source (e.g., solid, liquid, gaseous, etc.) used to move the vehicle.

Moreover, a configurable implementation of this chassis 101 can scale from the very small and simple to a complex chassis topology used by large SoC designs. As mentioned before, the abstraction of many IPs required to support an architectural feature or function is called a subsystem.

Figure 2:
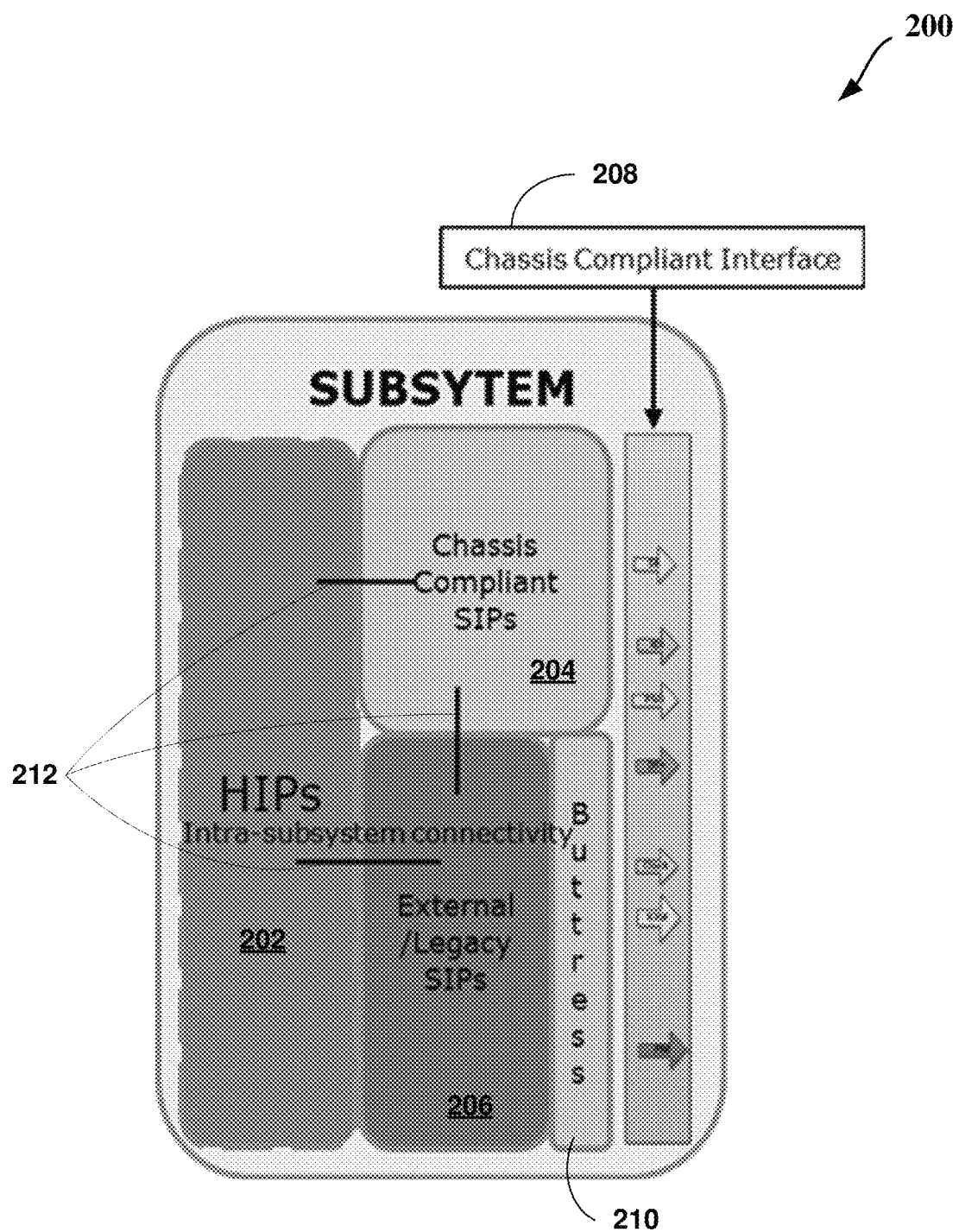
FIG. 2 illustrates a block diagram of a subsystem, according to an embodiment.

More particularly, FIG. 2 illustrates a block diagram of a subsystem 200, according to an embodiment. In an embodiment, the SoC 100 of FIG. 1 includes the subsystem 200. Components of the subsystem 200 include entities called IPs, such as one or more of: Hard IP(s) or HIP(s) 202, Soft IP(s) or SIP(s) 204, and external or legacy SIP(s) 206. In at least some embodiments, all IPs (whether hard or soft) are chassis compliant. Further, some examples of Hard IPs may include Graphics or CPU Cores, Analog and mixed signal logic for PLLs (Phase-Locked Loops), Physical (PHY) layer logic for DDR (Double Data Rate) memory, PCIe (Peripheral Component Interconnect express), etc., which may be directly dropped in an SoC. Soft IPs examples may include PCIe, Ethernet, USB controllers, etc. Moreover, external and legacy IPs can be separate IPs, where external generally refers to a new IP obtained from a third-party/external party and where legacy IPs generally refer to existing or available IPs. These IPs may be obtained from different sources and may have different interfaces. Components of the subsystem 200 can communicate with components of a chassis (such as chassis 101 of FIG. 1) via a chassis compliant interface 208 (e.g., via the various fabrics or interfaces discussed with reference to FIG. 1).

In one embodiment, a subsystem developer/designer can create the subsystem to comply to a standard set of chassis interfaces either by directly exposing interface of the IPs or through a set of bridges/shims/etc. called a buttress (such as logic 210). FIG. 2 shows how a group of IPs from multiple sources are integrated to form the subsystem 200. Also, as shown in FIG. 2, various IPs may communicate via inter-subsystem connectivity interfaces 212.

The description and packaging methodology of the subsystem allows all aspects of tools, flows, and methods that may be used for final SoC tape-out to be covered with a simple and structured description. This includes, but is not limited to: RTL, test bench collateral, validation tests, low power design collateral (UPF), synthesis constraints, static checks, fusing considerations/requirements, register validation content, software or logic routines that may be used by system firmware, etc.

Figure 3:
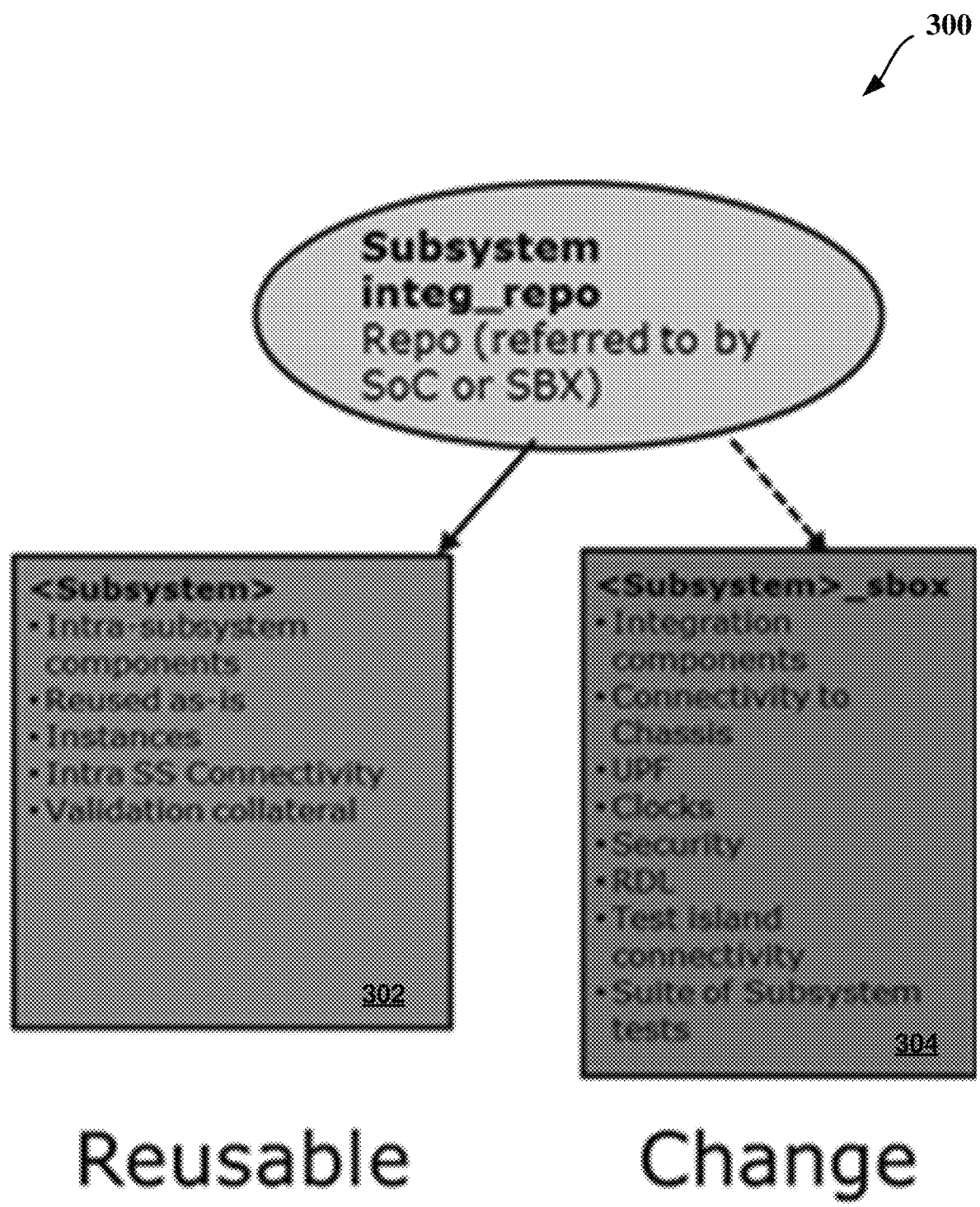
FIG. 3 illustrates a structure diagram of a subsystem integration repository, according to an embodiment.

FIG. 3 illustrates a structure diagram of a subsystem integration repository 300, according to an embodiment. In various embodiments, SoC 100 of FIG. 1 (and/or a Sandbox (SBX) logic) may refer to the subsystem integration repository 300.

As shown in FIG. 3, the subsystem description may be split into two parts: intra-subsystem 302 (which includes components that may be "reusable" from one design to another) and inter-subsystem 304 (which includes components that would likely "change" from one design to another). The intra-subsystem content abstracts the details of the subsystem that are subsystem-specific and that will not need to change from product to product. The inter-subsystem content contains the aspect of the subsystem that interact with other subsystems and that might be customized for a specific product.

As an example, the power domain that the IPs in the subsystem are associated with can be changed through the inter-subsystem content. As another example, the attach points for the various fabrics can be customized by changing the inter-subsystem content. As shown in FIG. 3, the intra-subsystem components may include components that are reusable amongst different products such as instances, intra Subsystem (SS) connectivity logic, validation collateral logic, etc. By contrast, the inter-subsystem components may include components that are changed for different products such as connectivity logic to chassis, low power design collateral (e.g., in accordance with Unified Power Format (UPF)), clock logic, security logic, RTL logic, test island connectivity, suite of subsystem tests, etc. As discussed herein, a "test island" generally refers to a packaging up of the verification collateral required for an IP. For example, a test island is a reusable piece of code/firmware/logic that instantiates all of the Bus Functional Models (BFMs), checkers, monitors, etc. for all interfaces of an IP. By packaging these elements into a test island, it becomes easier for the end SoC to include the correct interface verification collateral instantiated with minimal work.

Figure 4:
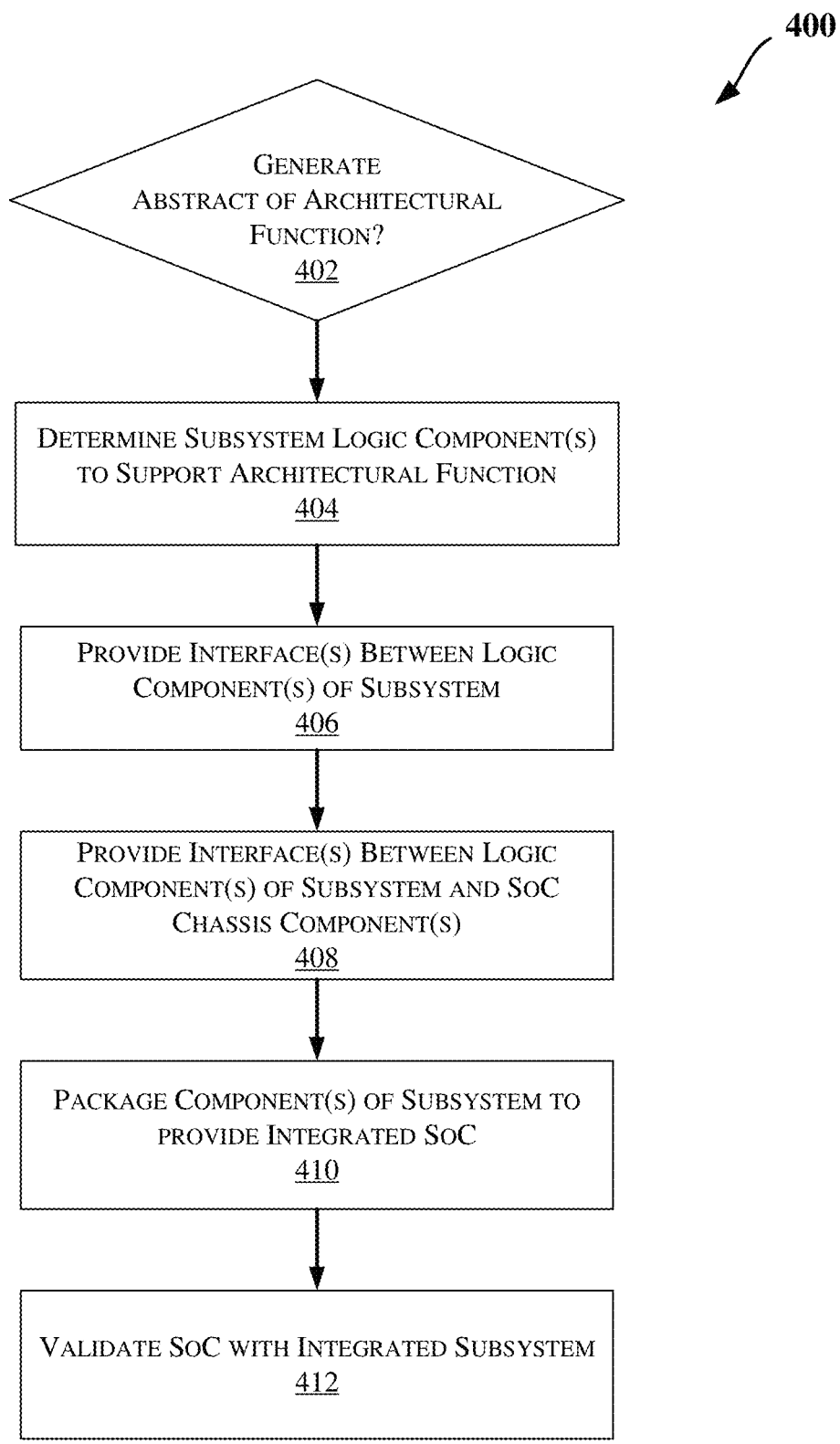
FIG. 4 illustrates a flow diagram of a method to integrate one or more subsystems into an SoC, according to one or more embodiments.

FIG. 4 illustrates a flow diagram of a method 400 to integrate one or more subsystems into an SoC, according to one or more embodiments. In various embodiments, various logic/components/interfaces discussed with reference to FIGS. 1-3 (such the processor 102 and/or graphics logic 103 of FIG. 1 and/or IPs discussed with reference to FIGS. 1-3) perform one or more operations of method 400.

Referring to FIGS. 1-4, at operation 402, it is determined whether to generate an abstraction for an architectural function. In an embodiment, a subsystem abstracts (e.g., all) logic components that are required for an architectural function. The determination of whether to generate the abstraction at operation 402 may be made based on a user/external request and/or an indication that a subsystem would have a sufficient number of reusable components across a plurality of products/designs (see, e.g., the discussion of FIG. 3). As discussed herein, an "architectural function" or "architectural feature" generally refers to a portion of an SoC capable of performing one or more operations to provide a distinct function, such as a USB (Universal Serial Bus), a PCIe (Peripheral Component Interconnect express) interface, a Controller Area Network (CAN) Bus, a security function, a manageability function, a display function, a graphics function, an imaging function, an artificial intelligence function, a Non-Volatile Memory express (NVMe) storage function, a Serial Advanced Technology Attachment (SATA) storage function, a video function, or an audio function.

At an operation 404, all components of the subsystem that are used to support the architectural function are determined. At operation 406, one or more interfaces between the logic components of the subsystem are provided (see, e.g., the discussion of FIG. 2). At operation 408, one or more interfaces between the logic components of the subsystem and one or more SoC chassis components are provided (see, e.g., the discussion of various interfaces/fabrics discussed with reference to FIGS. 1 and/or 2).

At operation 410, components of the subsystem (including the interface(s) of operations 406 and/or 408) are packaged to provide an integrated SoC. Moreover, the packaging of a subsystem creates a reusable collateral that enables fast integration for all aspects of design. Specifically, this packaging methodology can cover aspects of design beyond RTL (Register Transfer Level) integration, including but not limited to validation of content for (e.g., all) design tools, UPF content, register validation content, and any required fuse settings.

Method 400 terminates at operation 412 by validating the SoC with the integrated subsystem. The validation of the subsystem and all aspects of the integration with the chassis enables a correct and complete integration, and can guarantee functionality in any SoC of a compatible chassis. Accordingly, at least one embodiment defines a method to package components of an architectural function into a "subsystem" with well-defined interfaces to an SoC chassis. An implementation method may be further defined to package the design for reuse and integration into any compatible SoC chassis across (e.g., all) aspects of the design flow. Also, the developer of the subsystem may validate the subsystem and develop software with the subsystem and the chassis ahead of any actual product intercept or manufacture.

Figure 5:
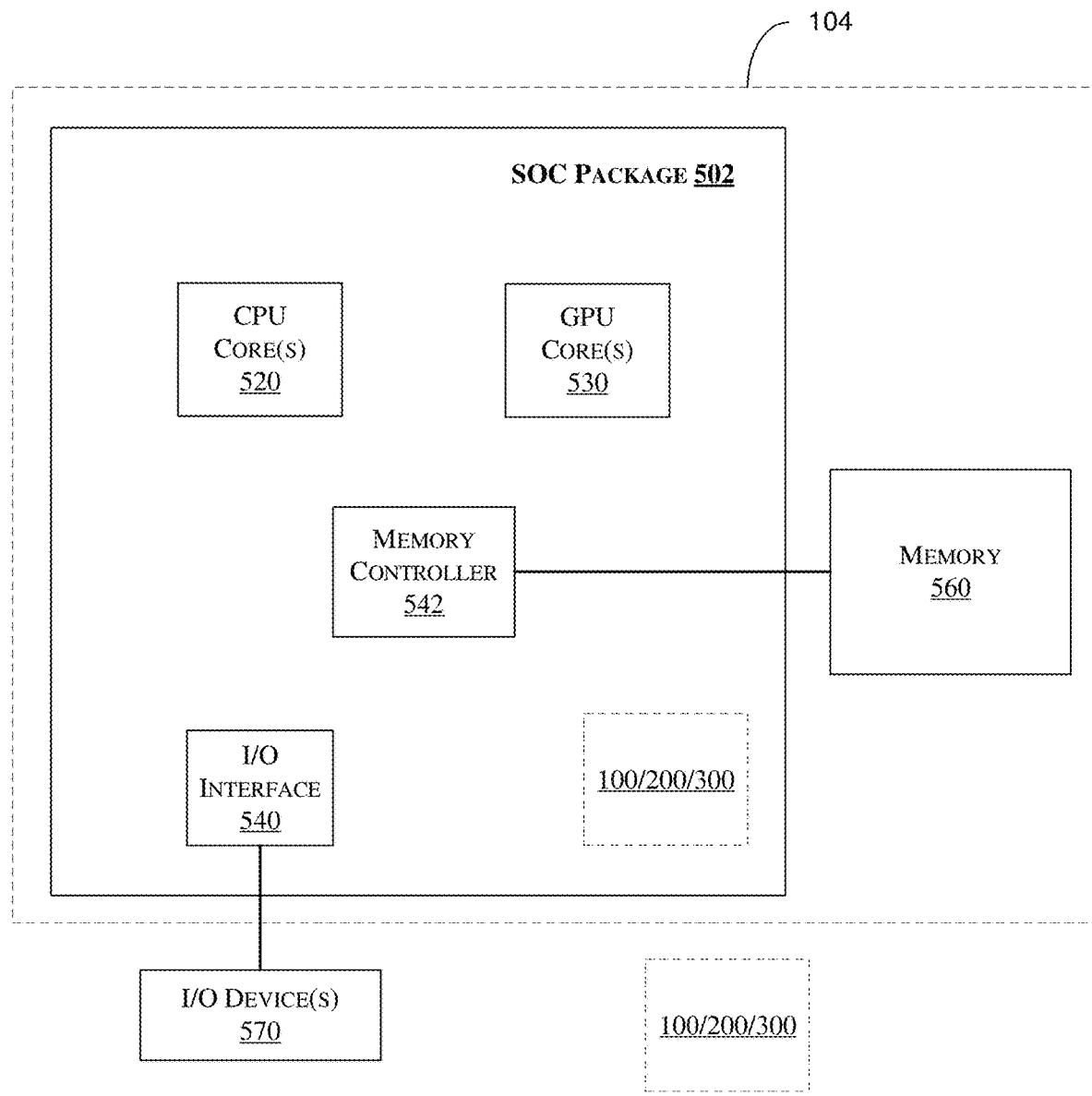
FIG. 5 illustrates a block diagram of an embodiment of a computing systems, which may be utilized in various embodiments discussed herein.

FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542. Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged into a single semiconductor device.

As illustrated in FIG. 5, SOC package 502 is coupled to a memory 560 via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like.

Figure 6:
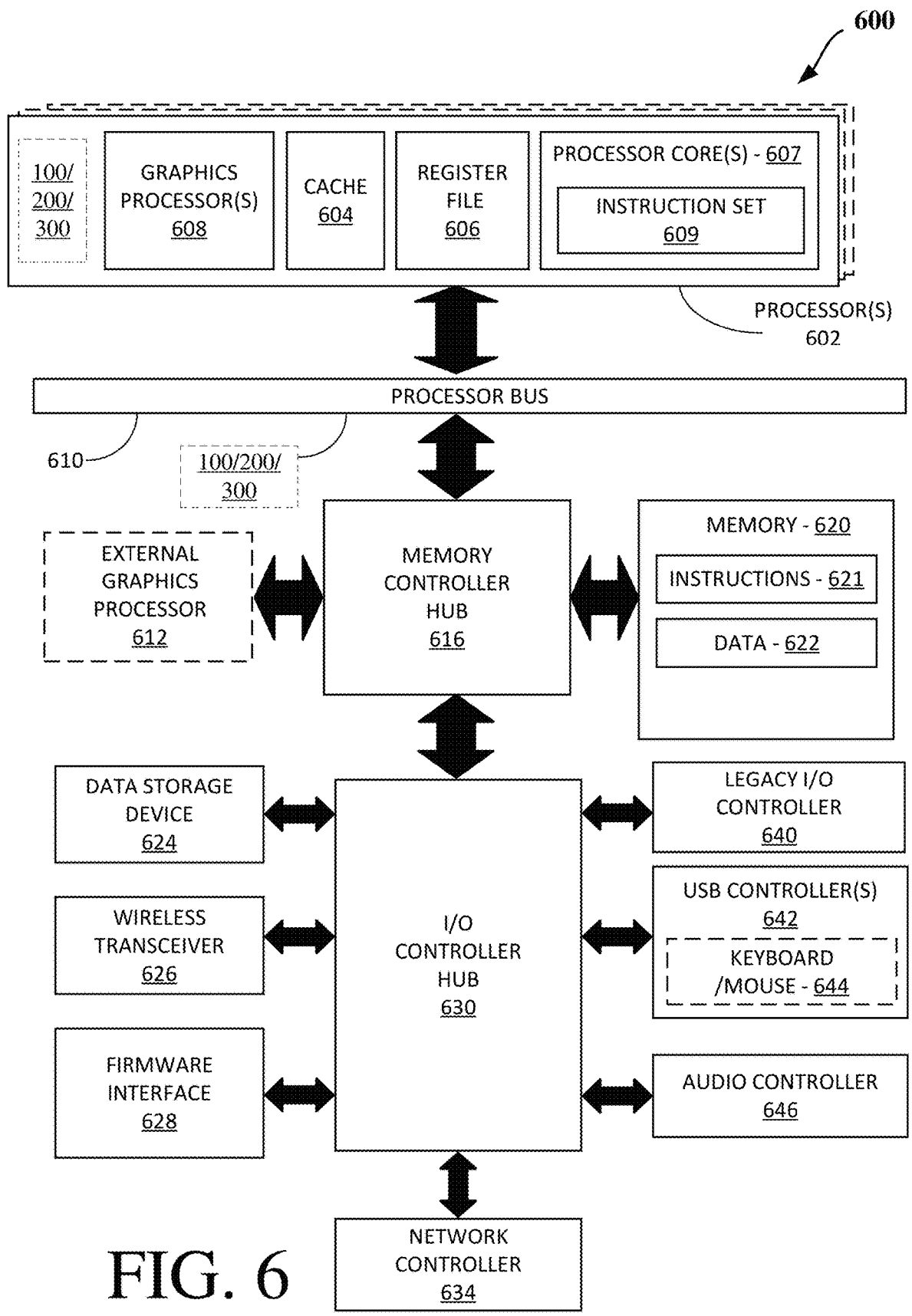
FIG. 6 illustrates a block diagram of an embodiment of a computing systems, which may be utilized in various embodiments discussed herein.

FIG. 6 is a block diagram of a processing system 600, according to an embodiment. In various embodiments the system 600 includes one or more processors 602 and one or more graphics processors 608, and may be a single processor desktop system, a multiprocessor workstation system, or a server system having a large number of processors 602 or processor cores 607. In on embodiment, the system 600 is a processing platform incorporated within a system-on-a-chip (SoC or SOC) integrated circuit for use in mobile, handheld, or embedded devices.

An embodiment of system 600 can include, or be incorporated within a server-based gaming platform, a game console, including a game and media console, a mobile gaming console, a handheld game console, or an online game console. In some embodiments system 600 is a mobile phone, smart phone, tablet computing device or mobile Internet device. Data processing system 600 can also include, couple with, or be integrated within a wearable device, such as a smart watch wearable device, smart eyewear device, augmented reality device, or virtual reality device. In some embodiments, data processing system 600 is a television or set top box device having one or more processors 602 and a graphical interface generated by one or more graphics processors 608.

In some embodiments, the one or more processors 602 each include one or more processor cores 607 to process instructions which, when executed, perform operations for system and user software. In some embodiments, each of the one or more processor cores 607 is configured to process a specific instruction set 609. In some embodiments, instruction set 609 may facilitate Complex Instruction Set Computing (CISC), Reduced Instruction Set Computing (RISC), or computing via a Very Long Instruction Word (VLIW). Multiple processor cores 607 may each process a different instruction set 609, which may include instructions to facilitate the emulation of other instruction sets. Processor core 607 may also include other processing devices, such a Digital Signal Processor (DSP).

In some embodiments, the processor 602 includes cache memory 604. Depending on the architecture, the processor 602 can have a single internal cache or multiple levels of internal cache. In some embodiments, the cache memory is shared among various components of the processor 602. In some embodiments, the processor 602 also uses an external cache (e.g., a Level-3 (L3) cache or Last Level Cache (LLC)) (not shown), which may be shared among processor cores 607 using known cache coherency techniques. A register file 606 is additionally included in processor 602 which may include different types of registers for storing different types of data (e.g., integer registers, floating point registers, status registers, and an instruction pointer register). Some registers may be general-purpose registers, while other registers may be specific to the design of the processor 602.

In some embodiments, processor 602 is coupled to a processor bus 610 to transmit communication signals such as address, data, or control signals between processor 602 and other components in system 600. In one embodiment the system 600 uses an exemplary 'hub' system architecture, including a memory controller hub 616 and an Input Output (I/O) controller hub 630. A memory controller hub 616 facilitates communication between a memory device and other components of system 600, while an I/O Controller Hub (ICH) 630 provides connections to I/O devices via a local I/O bus. In one embodiment, the logic of the memory controller hub 616 is integrated within the processor.

Memory device 620 can be a dynamic random access memory (DRAM) device, a static random access memory (SRAM) device, flash memory device, phase-change memory device, or some other memory device having suitable performance to serve as process memory. In one embodiment the memory device 620 can operate as system memory for the system 600, to store data 622 and instructions 621 for use when the one or more processors 602 executes an application or process. Memory controller hub 616 also couples with an optional external graphics processor 612, which may communicate with the one or more graphics processors 608 in processors 602 to perform graphics and media operations.

In some embodiments, ICH 630 enables peripherals to connect to memory device 620 and processor 602 via a high-speed I/O bus. The I/O peripherals include, but are not limited to, an audio controller 646, a firmware interface 628, a wireless transceiver 626 (e.g., Wi-Fi, Bluetooth), a data storage device 624 (e.g., hard disk drive, flash memory, etc.), and a legacy I/O controller 640 for coupling legacy (e.g., Personal System 2 (PS/2)) devices to the system. One or more Universal Serial Bus (USB) controllers 642 connect input devices, such as keyboard and mouse 644 combinations. A network controller 634 may also couple to ICH 630. In some embodiments, a high-performance network controller (not shown) couples to processor bus 610. It will be appreciated that the system 600 shown is exemplary and not limiting, as other types of data processing systems that are differently configured may also be used. For example, the I/O controller hub 630 may be integrated within the one or more processor 602, or the memory controller hub 616 and I/O controller hub 630 may be integrated into a discreet external graphics processor, such as the external graphics processor 612.

Figure 7:
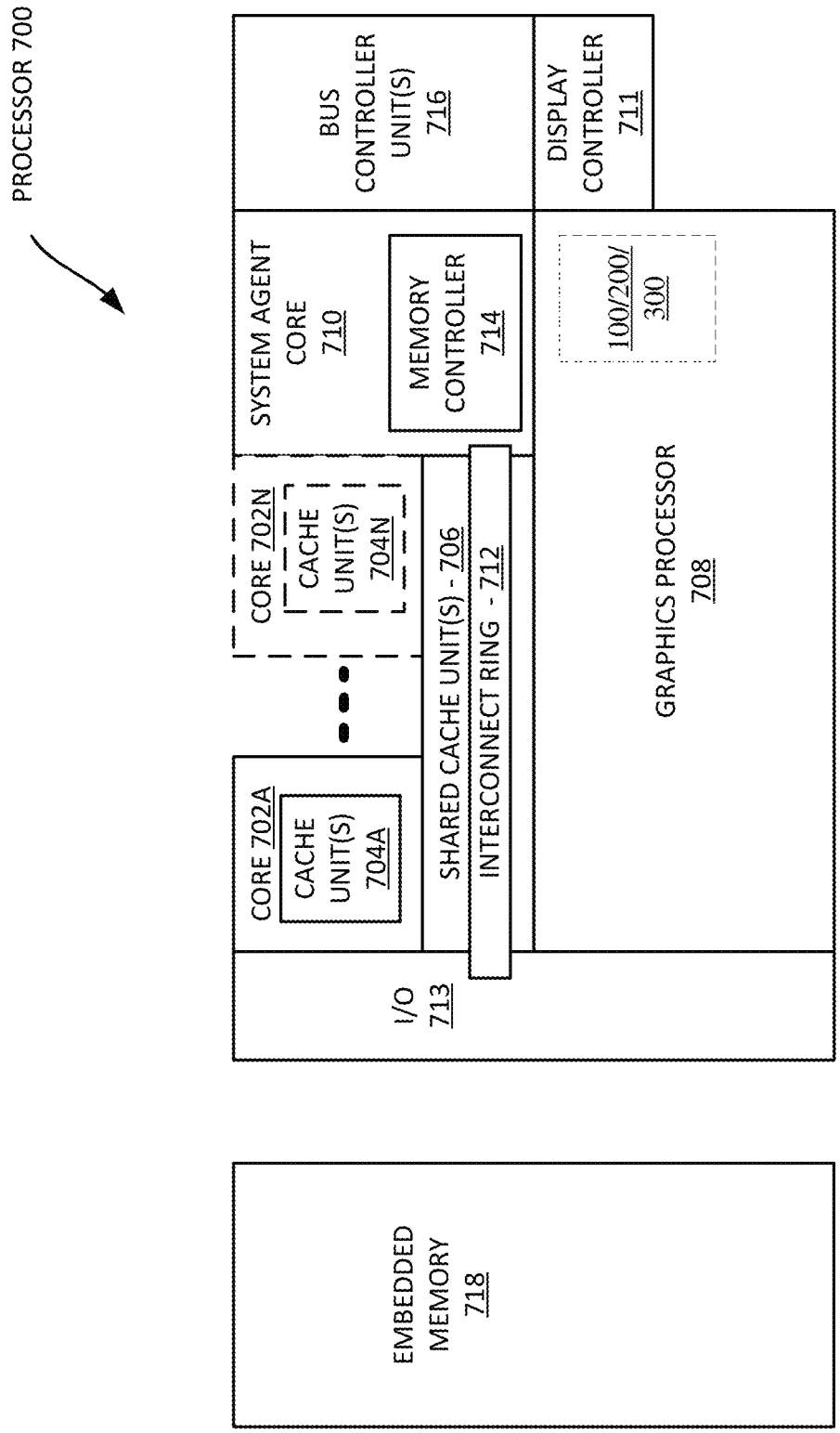
FIG. 7 illustrates various components of a processor in accordance with some embodiments.

FIG. 7 is a block diagram of an embodiment of a processor 700 having one or more processor cores 702A to 702N, an integrated memory controller 714, and an integrated graphics processor 708. Those elements of FIG. 7 having the same reference numbers (or names) as the elements of any other figure herein can operate or function in any manner similar to that described elsewhere herein, but are not limited to such. Processor 700 can include additional cores up to and including additional core 702N represented by the dashed lined boxes. Each of processor cores 702A to 702N includes one or more internal cache units 704A to 704N. In some embodiments each processor core also has access to one or more shared cached units 706.

The internal cache units 704A to 704N and shared cache units 706 represent a cache memory hierarchy within the processor 700. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 706 and 704A to 704N.

In some embodiments, processor 700 may also include a set of one or more bus controller units 716 and a system agent core 710. The one or more bus controller units 716 manage a set of peripheral buses, such as one or more Peripheral Component Interconnect buses (e.g., PCI, PCI Express). System agent core 710 provides management functionality for the various processor components. In some embodiments, system agent core 710 includes one or more integrated memory controllers 714 to manage access to various external memory devices (not shown).

In some embodiments, one or more of the processor cores 702A to 702N include support for simultaneous multi-threading. In such embodiment, the system agent core 710 includes components for coordinating and operating cores 702A to 702N during multi-threaded processing. System agent core 710 may additionally include a power control unit (PCU), which includes logic and components to regulate the power state of processor cores 702A to 702N and graphics processor 708.

In some embodiments, processor 700 additionally includes graphics processor 708 to execute graphics processing operations. In some embodiments, the graphics processor 708 couples with the set of shared cache units 706, and the system agent core 710, including the one or more integrated memory controllers 714. In some embodiments, a display controller 711 is coupled with the graphics processor 708 to drive graphics processor output to one or more coupled displays. In some embodiments, display controller 711 may be a separate module coupled with the graphics processor via at least one interconnect, or may be integrated within the graphics processor 708 or system agent core 710.

In some embodiments, a ring-based interconnect unit 712 is used to couple the internal components of the processor 700. However, an alternative interconnect unit may be used, such as a point-to-point interconnect, a switched interconnect, or other techniques, including techniques well known in the art. In some embodiments, graphics processor 708 couples with the ring interconnect 712 via an I/O link 713.

The exemplary I/O link 713 represents at least one of multiple varieties of I/O interconnects, including an on package I/O interconnect which facilitates communication between various processor components and a high-performance embedded memory module 718, such as an eDRAM (or embedded DRAM) module. In some embodiments, each of the processor cores 702 to 702N and graphics processor 708 use embedded memory modules 718 as a shared Last Level Cache.

In some embodiments, processor cores 702A to 702N are homogenous cores executing the same instruction set architecture. In another embodiment, processor cores 702A to 702N are heterogeneous in terms of instruction set architecture (ISA), where one or more of processor cores 702A to 702N execute a first instruction set, while at least one of the other cores executes a subset of the first instruction set or a different instruction set. In one embodiment processor cores 702A to 702N are heterogeneous in terms of microarchitecture, where one or more cores having a relatively higher power consumption couple with one or more power cores having a lower power consumption. Additionally, processor 700 can be implemented on one or more chips or as an SoC integrated circuit having the illustrated components, in addition to other components.

The following examples pertain to further embodiments. Example 1 includes an apparatus comprising: logic circuitry to determine one or more components of a subsystem, wherein the subsystem is to support an architectural feature to be implemented on a System on Chip (SoC) device; wherein the logic circuitry is to determine a first interface to communicatively couple a first component of the subsystem to a second component of the subsystem or communicatively couple the first component of the subsystem to a first component of another subsystem, wherein the logic circuitry is to determine a second interface to communicatively couple at least one component of the subsystem to at least one chassis component of the SoC device or to communicatively couple the at least one component of the subsystem to at least one non-chassis component of the other subsystem, wherein the subsystem is to be integrated into a chassis of the SoC device to allow for validation of the architectural feature. Example 2 includes the apparatus of example 1, wherein the first interface or the second interface comprise at least one of: a coherent fabric, a mesh network, an Open Core Protocol (OCP) interface, an Advanced Extensible Interface (AXI), an On-die System Fabric (OSF), a non-coherent fabric, a Universal Serial Bus (USB), a Peripheral Component Interconnect express (PCIe) interface, an Internetwork Packet Exchange (IPx) interface, a Serial Advanced Technology Attachment (SATA) interface, or a Controller Area Network (CAN) Bus. Example 3 includes the apparatus of example 1, wherein the chassis comprises one or more of: a power unit, a coherent fabric, an On-die System Fabric (OSF), a non-coherent fabric, and one or more Intellectual Property (IP) logic blocks. Example 4 includes the apparatus of example 3, wherein the non-coherent fabric is to communicatively couple two or more components of the chassis and/or the subsystem, wherein the two or more components do not include a cache or memory that is to be kept coherent. Example 5 includes the apparatus of example 3, wherein the coherent fabric is to communicatively couple two or more components of the chassis and/or the subsystem, wherein the two or more components include a cache or memory that is to be kept coherent. Example 6 includes the apparatus of example 1, wherein the architectural feature comprises one or more of: a Universal Serial Bus (USB), a Peripheral Component Interconnect express (PCIe) interface, a Controller Area Network (CAN) Bus, a security function, a manageability function, a display function, a graphics function, an imaging function, an artificial intelligence function, a Non-Volatile Memory express (NVMe) storage function, a Serial Advanced Technology Attachment (SATA) storage function, a video function, or an audio function. Example 7 includes the apparatus of example 1, wherein the integration of the subsystem into the chassis of the SoC device allows for validation of a relationship between the architectural feature and another chassis feature or another architectural feature. Example 8 includes the apparatus of example 1, wherein the integration of the subsystem into the chassis of the SoC device allows for validation of a relationship between the architectural feature and another chassis feature or another architectural feature prior to manufacture. Example 9 includes the apparatus of example 1, comprising logic circuitry to package components of the subsystem. Example 10 includes the apparatus of example 1, comprising logic circuitry to package components of the subsystem, wherein packaging of the components of the subsystem is to generate a reusable collateral that allows for fast integration of all aspects of design in any SoC device with a compatible chassis prior to manufacture. Example 11 includes the apparatus of example 1, comprising logic circuitry to validate the SoC device integrated with the subsystem. Example 12 includes the apparatus of example 1, wherein the subsystem is to abstract the plurality of components. Example 13 includes the apparatus of example 1, wherein the architectural feature comprises a portion of the SoC device that is capable of performing one or more operations to provide a distinct function. Example 14 includes the apparatus of example 1, wherein a general-purpose processor or a graphics processor comprises the logic circuitry. Example 15 includes the apparatus of example 14, wherein the general-purpose processor or the graphics processor each comprise one or more processor cores. Example 16 includes the apparatus of example 1, wherein the SoC device comprises one or more of: the logic circuitry, a processor, a graphics processor, and memory. Example 17 includes the apparatus of example 1, wherein an Internet of Things (IoT) device or a vehicle comprises one or more of: the logic circuitry, the SoC, the subsystem, one or more processors, and memory. Example 18 includes the apparatus of example 17, wherein the vehicle is one of: an automobile, a truck, a motorcycle, an airplane, a helicopter, a vessel/ship, a train, or a drone. Example 19 includes the apparatus of example 1, wherein the subsystem comprises an intra-subsystem and an inter-subsystem, wherein the intra-subsystem comprises at least one component that is reusable from one design to another design, wherein the inter-subsystem comprises at least one component that changes across different designs.

Example 20 includes one or more computer-readable media comprising one or more instructions that when executed on at least one processor configure the at least one processor to perform one or more operations to: determine one or more components of a subsystem, wherein the subsystem is to support an architectural feature to be implemented on a System on Chip (SoC) device; determine a first interface to communicatively couple a first component of the subsystem to a second component of the subsystem or communicatively couple the first component of the subsystem to a first component of another subsystem; and determine a second interface to communicatively couple at least one component of the subsystem to at least one chassis component of the SoC device or to communicatively couple the at least one component of the subsystem to at least one non-chassis component of the other subsystem, wherein the subsystem is to be integrated into a chassis of the SoC device to allow for validation of the architectural feature. Example 21 includes the one or more computer-readable media of example 20, further comprising one or more instructions that when executed on the at least one processor configure the at least one processor to perform one or more operations to cause the integration of the subsystem into the chassis of the SoC device to allow for validation of a relationship between the architectural feature and another chassis feature or another architectural feature. Example 22 includes the one or more computer-readable media of example 20, further comprising one or more instructions that when executed on the at least one processor configure the at least one processor to perform one or more operations to cause the integration of the subsystem into the chassis of the SoC device to allow for validation of a relationship between the architectural feature and another chassis feature or another architectural feature prior to manufacture.

Example 23 includes a method comprising: determining one or more components of a subsystem, wherein the subsystem is to support an architectural feature to be implemented on a System on Chip (SoC) device; determining a first interface to communicatively couple a first component of the subsystem to a second component of the subsystem or communicatively couple the first component of the subsystem to a first component of another subsystem; and determining a second interface to communicatively couple at least one component of the subsystem to at least one chassis component of the SoC device or to communicatively couple the at least one component of the subsystem to at least one non-chassis component of the other subsystem, wherein the subsystem is to be integrated into a chassis of the SoC device to allow for validation of the architectural feature. Example 24 includes the method of example 23, wherein the integration of the subsystem into the chassis of the SoC device allows for validation of a relationship between the architectural feature and another chassis feature or another architectural feature. Example 25 includes the method of example 23, the integration of the subsystem into the chassis of the SoC device allows for validation of a relationship between the architectural feature and another chassis feature or another architectural feature prior to manufacture.

Example 26 includes an apparatus comprising means to perform a method as set forth in any preceding example. Example 27 includes machine-readable storage including machine-readable instructions, when executed, to implement a method or realize an apparatus as set forth in any preceding example.

In various embodiments, the operations discussed herein, e.g., with reference to FIG. 1 et seq., may be implemented as hardware (e.g., logic circuitry or more generally circuitry or circuit), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIG. 1 et seq.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   logic circuitry to determine one or more components of a subsystem, wherein the subsystem is to support an architectural feature to be implemented on a System on Chip (SoC) device;
   wherein the logic circuitry is to determine a first interface to communicatively couple a first component of the subsystem to a second component of the subsystem, wherein the logic circuitry is to determine a second interface to communicatively couple at least one component of the subsystem to at least one chassis component of the SoC device or to communicatively couple the at least one component of the subsystem to at least one non-chassis component of the other subsystem,
   wherein the subsystem is to be integrated into a chassis of the SoC device to allow for validation of the architectural feature.

2. The apparatus of claim 1, wherein the first interface or the second interface comprise at least one of: a coherent fabric, a mesh network, an Open Core Protocol (OCP)

interface, an Advanced Extensible Interface (AXI), an On-die System Fabric (OSF), a non-coherent fabric, a Universal Serial Bus (USB), a Peripheral Component Interconnect express (PCIe) interface, an Internetwork Packet Exchange (IPx) interface, a Serial Advanced Technology Attachment (SATA) interface, or a Controller Area Network (CAN) Bus.

3. The apparatus of claim 1, wherein the chassis comprises one or more of: a power unit, a coherent fabric, an On-die System Fabric (OSF), a non-coherent fabric, and one or more Intellectual Property (IP) logic blocks.

4. The apparatus of claim 3, wherein the non-coherent fabric is to communicatively couple two or more components of the chassis and/or the subsystem, wherein the two or more components do not include a cache or memory that is to be kept coherent.

5. The apparatus of claim 3, wherein the coherent fabric is to communicatively couple two or more components of the chassis and/or the subsystem, wherein the two or more components include a cache or memory that is to be kept coherent.

6. The apparatus of claim 1, wherein the architectural feature comprises one or more of: a Universal Serial Bus (USB), a Peripheral Component Interconnect express (PCIe) interface, a Controller Area Network (CAN) Bus, a security function, a manageability function, a display function, a graphics function, an imaging function, an artificial intelligence function, a Non-Volatile Memory express (NVMe) storage function, a Serial Advanced Technology Attachment (SATA) storage function, a video function, or an audio function.

7. The apparatus of claim 1, wherein the integration of the subsystem into the chassis of the SoC device allows for validation of a relationship between the architectural feature and another chassis feature or another architectural feature.

8. The apparatus of claim 1, wherein the integration of the subsystem into the chassis of the SoC device allows for validation of a relationship between the architectural feature and another chassis feature or another architectural feature prior to manufacture.

9. The apparatus of claim 1, comprising logic circuitry to package components of the subsystem.

10. The apparatus of claim 1, comprising logic circuitry to package components of the subsystem, wherein packaging of the components of the subsystem is to generate a reusable collateral that allows for fast integration of all aspects of design in any SoC device with a compatible chassis prior to manufacture.

11. The apparatus of claim 1, comprising logic circuitry to validate the SoC device integrated with the subsystem.

12. The apparatus of claim 1, wherein the subsystem is to abstract the plurality of components.

13. The apparatus of claim 1, wherein the architectural feature comprises a portion of the SoC device that is capable of performing one or more operations to provide a distinct function.

14. The apparatus of claim 1, wherein a general-purpose processor or a graphics processor comprises the logic circuitry.

15. The apparatus of claim 14, wherein the general-purpose processor or the graphics processor each comprise one or more processor cores.

16. The apparatus of claim 1, wherein the SoC device comprises one or more of: the logic circuitry, a processor, a graphics processor, and memory.

17. The apparatus of claim 1, wherein an Internet of Things (IoT) device or a vehicle comprises one or more of: the logic circuitry, the SoC, the subsystem, one or more processors, and memory.

18. The apparatus of claim 17, wherein the vehicle is one of: an automobile, a truck, a motorcycle, an airplane, a helicopter, a vessel/ship, a train, or a drone.

19. The apparatus of claim 1, wherein the subsystem comprises an intra-subsystem and an inter-subsystem, wherein the intra-subsystem comprises at least one component that is reusable from one design to another design, wherein the inter-subsystem comprises at least one component that changes across different designs.

20. One or more computer-readable media comprising one or more instructions that when executed on at least one processor configure the at least one processor to perform one or more operations to:
  determine one or more components of a subsystem, wherein the subsystem is to support an architectural feature to be implemented on a System on Chip (SoC) device;
  determine a first interface to communicatively couple a first component of the subsystem to a second component of the subsystem; and
  determine a second interface to communicatively couple at least one component of the subsystem to at least one chassis component of the SoC device or to communicatively couple the at least one component of the subsystem to at least one non-chassis component of the other subsystem,
  wherein the subsystem is to be integrated into a chassis of the SoC device to allow for validation of the architectural feature.

21. The one or more computer-readable media of claim 20, further comprising one or more instructions that when executed on the at least one processor configure the at least one processor to perform one or more operations to cause the integration of the subsystem into the chassis of the SoC device to allow for validation of a relationship between the architectural feature and another chassis feature or another architectural feature.

22. The one or more computer-readable media of claim 20, further comprising one or more instructions that when executed on the at least one processor configure the at least one processor to perform one or more operations to cause the integration of the subsystem into the chassis of the SoC device to allow for validation of a relationship between the architectural feature and another chassis feature or another architectural feature prior to manufacture.

23. A method comprising:
  determining one or more components of a subsystem, wherein the subsystem is to support an architectural feature to be implemented on a System on Chip (SoC) device;
  determining a first interface to communicatively couple a first component of the subsystem to a second component of the subsystem; and
  determining a second interface to communicatively couple at least one component of the subsystem to at least one chassis component of the SoC device or to communicatively couple the at least one component of the subsystem to at least one non-chassis component of the other subsystem,
  wherein the subsystem is to be integrated into a chassis of the SoC device to allow for validation of the architectural feature.

24. The method of claim 23, wherein the integration of the subsystem into the chassis of the SoC device allows for validation of a relationship between the architectural feature and another chassis feature or another architectural feature.

25. The method of claim 23, the integration of the subsystem into the chassis of the SoC device allows for validation of a relationship between the architectural feature and another chassis feature prior to manufacture or another architectural feature.

* * * * *